(12) United States Patent
Sridharan et al.

(10) Patent No.: US 8,085,080 B2
(45) Date of Patent: Dec. 27, 2011

(54) GENERATION OF A LOW JITTER CLOCK SIGNAL

(75) Inventors: Srinath Sridharan, Bangalore (IN); Ramkishore Ganti, Bangalore (IN); Patrick Guyard, Erce en Lamee (FR)

(73) Assignees: ST-Ericsson SA, Plan-les-Ouates (CH); ST-Ericsson India Pvt. Ltd., New Delhi (IN)

( * ) Notice: Subject to any disclaimer, the term of this patent is extended or adjusted under 35 U.S.C. 154(b) by 0 days.

(21) Appl. No.: 12/714,150

(22) Filed: Feb. 26, 2010

(65) Prior Publication Data
US 2010/0219871 A1    Sep. 2, 2010

(30) Foreign Application Priority Data
Feb. 27, 2009   (EP) .................................... 09305184

(51) Int. Cl.
*H03K 17/16*    (2006.01)

(52) U.S. Cl. ........................................ 327/379; 327/112
(58) Field of Classification Search .................. 327/108, 327/112, 170, 379, 391; 326/80–83, 86–87
See application file for complete search history.

(56) References Cited

U.S. PATENT DOCUMENTS

| | | | |
|---|---|---|---|
| 6,717,445 B1 * | 4/2004 | Nair | ............................. 327/112 |
| 7,193,441 B2 * | 3/2007 | Chen et al. | ...................... 326/81 |

* cited by examiner

*Primary Examiner* — An Luu
(74) *Attorney, Agent, or Firm* — Potomac Patent Group PLLC (57) ABSTRACT

Systems and methods for generation of a low jitter clock signal for wireless circuits are disclosed. In an implementation, the system includes a wireless circuit powered by a first power supply and a low jitter clock (LJC) generator powered by a second power supply. The LJC generator provides at least one clock signal to the wireless circuit. The system further includes an LJC driver circuit including a clock buffer powered by the first power supply and a receive buffer powered by the second power supply.

18 Claims, 5 Drawing Sheets

GENERATION OF A LOW JITTER CLOCK SIGNAL

RELATED APPLICATION

The present application claims priority of European Patent Application No. 09305184.5 filed Feb. 27, 2009.

BACKGROUND

1. Technical Field

The disclosed subject matter relates to a system for generation of low jitter clock signals. More particularly, the subject matter relates to a system for providing a low jitter clock signal for wireless circuits, such as a Bluetooth circuit or a GPS circuit.

2. Description of the Related Art

Wireless technologies such as Bluetooth, Wi-Fi, and WLAN are increasingly becoming the preferred modes of network communication through mobile as well as fixed wireless communication devices. Wireless technologies are generally implemented through complex electrical circuits including a variety of analog blocks and digital blocks. The analog blocks include components, such as pre-amplifiers, analog filters, and wireless circuits. The digital blocks include components, such as microcontrollers and digital signal processing (DSP) accelerators. Generally, the analog and digital blocks are either integrated on a single chip or placed in close proximity to provide cost effective and compact wireless devices. For this, in one approach, various components, such as a clock generator and a power supply, which are common to different blocks are shared amongst the different blocks on a chip.

Although such an approach involving component sharing significantly reduces space constraints on the chip, the signals of the shared components can interfere with each other and with clock signals generated by the clock generator during operation of the chip. This interference can be caused due to overlapping of noise from the analog and the digital blocks, both being directly or indirectly coupled to the clock generator through a common power supply, thereby causing distortion in the clock signals. The distorted clock signals suffer from various imperfections, such as frequency drifts, phase shifts, and jitters, which adversely affect the desired RF signal output from the chip.

Generally, a jitter may get introduced in the clock signal due to a change in current across various current carrying blocks, such as a radio-frequency (RF) transceiver circuit, output buffers, and audio drivers. Such fluctuations can occur due to sudden activation and deactivation of the current carrying blocks. The fluctuations in the current across different blocks get coupled to the clock signals through a shared conducting path or a common power supply shared between the current carrying blocks and the clock generator. Generally, the shared conducting path of the common power supply contributes to large common impedance, due to which any fluctuation in current flowing through the current carrying blocks or the clock generator stimulates an unwanted phase shift in the clock signals.

Additionally, the clock generator and the digital blocks share a common power supply and common ground connections. As a result, frequent variations in the electrical state of the digital blocks introduce jitters in the clock signals due to coupling between the common power supply and the clock signals. Moreover, a fluctuating power supply provided by a direct current-to-direct current (DC-DC) converter to various circuits, such as a clock divider circuit, may introduce jitters in the clock signals passing through these circuits due to capacitive and magnetic couplings between the clock signals and the applied power supply.

BRIEF SUMMARY

This summary is provided to introduce concepts related to a system for generation of a low jitter clock signal for wireless circuits, such as a Bluetooth circuit, which is further described below in the detailed description. This summary is not intended to identify features of the claimed subject matter, nor is it intended for use in determining the scope of the claimed subject matter.

In an embodiment, the system includes a radio frequency (RF) block, a digital block, a direct current-to-direct current (DC-DC) converter, and a low jitter clock (LJC) driver circuit. The RF block includes an LJC generation circuit having an LJC generator, which generates LJC signals for a wireless circuit located on the same chip. The LJC driver circuit includes a clock buffer and a receive buffer.

Further, a common power supply is shared by the RF block, the digital block, and the LJC generator through a Kelvin connection. The Kelvin connection reduces common impedance of the conducting path of the power supply such that the jitters due to voltage fluctuations in the power supply are substantially reduced in the clock signals. The power supply is also shared between a radio frequency (RF) block and the DC-DC converter, again through the Kelvin connection. Therefore, voltage fluctuations coupled to the power supply are not coupled with the clock signals generated by the LJC generator, and thus generally do not distort the clock signals.

Moreover, the generated clock signals are passed through the receive buffer supplied with the common power supply, hereinafter referred to as LJC power supply, provided to the LJC generator. The receive buffer sharpens the edge rate of the clock signals such that the transition time of the clock signals is reduced to avoid introduction of noise in the clock signals due to coupling of the LJC power supply with the clock signals. Subsequently, the sharpened clock signals are driven to the wireless circuits through the clock buffer supplied with a power supply, hereinafter referred to as clock buffer power supply. On account of the clock signals being operated on with the LJC power supply and then with the clock buffer power supply of the wireless circuits, the coupling of the clock signals with the clock buffer power supply and the LJC power supply is reduced. As a result, introduction of noise in the clock signals due to coupling between the power supplies and the clock signals, which occurs in conventional systems, is substantially reduced.

In an embodiment, a system, comprises: at least one wireless circuit powered by a first power supply; a low jitter clock (LJC) generator to provide at least one clock signal to the wireless circuit, wherein the LJC generator is powered by a second power supply; and an LJC driver circuit configured to receive the clock signal from the LJC generator and transmit the clock signal to the wireless circuit after processing the clock signal, wherein the LJC driver circuit comprises a clock buffer powered by the first power supply and a receive buffer powered by the second power supply. In an embodiment, the receive buffer sharpens the clock signal to provide a sharpened clock signal to the clock buffer. In an embodiment, the clock buffer buffers the sharpened clock signal to provide a buffered clock signal to the wireless circuit. In an embodiment, the LJC generator is dedicated to the wireless circuit. In an embodiment, the wireless circuit is a Bluetooth circuit. In an embodiment, the wireless circuit and the LJC generator are disposed on a single chip. In an embodiment, the LJC generator is part of an LJC generation circuit included in a radio frequency block. In an embodiment, the receive buffer comprises at least one inverter.

In an embodiment, a system comprises: a low jitter clock (LJC) generator to provide at least one clock signal; and an LJC driver circuit comprising: a receive buffer to receive the clock signal from the LJC generator, wherein the receive buffer sharpens the clock signal to provide a sharpened clock signal; and a clock buffer to buffer the sharpened clock signal and provide the buffered clock signal to a wireless circuit. In an embodiment, the system comprises an RF block that includes an LJC generation circuit, wherein the LJC generation circuit includes the LJC generator. In an embodiment, the RF block shares a common power supply with at least one digital block and at least one direct current-to-direct current (DC-DC) converter through a Kelvin connect configuration. In an embodiment, the receive buffer comprises at least one inverter. In an embodiment, the clock buffer and the wireless circuit share a first power supply. In an embodiment, the LJC generator and the receive buffer share a second power supply.

In an embodiment, a method comprises: generating a clock signal; sharpening the clock signal to provide a sharpened clock signal; buffering the sharpened clock signal to provide a buffered clock signal; and providing the buffered clock signal to a wireless circuit. In an embodiment, sharpening the clock signal comprises increasing a rate of change of an edge of the clock signal.

In an embodiment, a system comprises: a wireless circuit configured to receive power from a first power supply; a low jitter clock (LJC) generator configured to provide a clock signal to the wireless circuit, wherein the LJC generator is configured to receive power from a second power supply; and an LJC driver circuit configured to receive the clock signal from the LJC generator and transmit the clock signal to the wireless circuit after processing the clock signal, wherein the LJC driver circuit comprises a clock buffer configured to receive power from the first power supply and a receive buffer configured to receive power from the second power supply. In an embodiment, the receive buffer is configured to sharpen the clock signal to provide a sharpened clock signal to the clock buffer. In an embodiment, the clock buffer is configured to buffer the sharpened clock signal to provide a buffered clock signal to the wireless circuit. In an embodiment, the LJC generator is dedicated to the wireless circuit. In an embodiment, the wireless circuit is a short-range communication circuit. In an embodiment, the wireless circuit is a Bluetooth circuit. In an embodiment, the wireless circuit and the LJC generator are disposed on a single chip. In an embodiment, the LJC generator is part of an LJC generation circuit included in a radio frequency block. In an embodiment, the receive buffer comprises at least one inverter.

In an embodiment, a system comprises: a low jitter clock (LJC) generator configured to provide at least one clock signal; and an LJC driver circuit comprising: a receive buffer to receive the clock signal from the LJC generator, wherein the receive buffer is configured to sharpen the clock signal to provide a sharpened clock signal; and a clock buffer configured to buffer the sharpened clock signal and provide the buffered clock signal to a wireless circuit. In an embodiment, the system comprises an RF block that includes an LJC generation circuit, wherein the LJC generation circuit includes the LJC generator. In an embodiment, the RF block shares a common power supply with at least one digital block and at least one direct current-to-direct current (DC-DC) converter through a Kelvin connect configuration. In an embodiment, the receive buffer comprises at least one inverter. In an embodiment, the clock buffer and the wireless circuit share a first power supply. In an embodiment, wherein the LJC generator and the receive buffer share a second power supply.

In an embodiment, a method comprises: generating a clock signal; sharpening the clock signal to provide a sharpened clock signal; buffering the sharpened clock signal to provide a buffered clock signal; and providing the buffered clock signal to a wireless circuit. In an embodiment, the sharpening the clock signal comprises increasing a rate of change of an edge of the clock signal. In an embodiment, sharpening the clock signal comprises providing the clock signal to a first buffer powered by a first power supply; and buffering the sharpened clock signal comprises providing the sharpened clock signal to a second buffer powered by a second power supply.

In an embodiment, a system comprises: means for generating a clock signal; means for sharpening the clock signal to provide a sharpened clock signal; means for buffering the sharpened clock signal to provide a buffered clock signal; and means for providing the buffered clock signal to a wireless circuit. In an embodiment, the means for sharpening the clock signal is configured to increase a rate of change of an edge of the clock signal. In an embodiment, the means for sharpening comprises an inverter. In an embodiment, the means for sharpening the clock signal is coupled to a first power supply; and the means for buffering is coupled to a second power supply.

BRIEF DESCRIPTION OF THE SEVERAL VIEWS OF THE DRAWINGS

The detailed description is provided with reference to the accompanying figures. In the figures, the left-most digit(s) of a reference number identifies the figure in which the reference number first appears. The same numbers are used throughout the drawings to reference like features and components, unless the context indicates otherwise.

DETAILED DESCRIPTION

The disclosed subject matter relates to a system for generation of low jitter clock signals. More particularly, the subject matter relates to a system for providing a low jitter clock signal for wireless circuits, such as a Bluetooth circuit or a GPS circuit.

In the following description, numerous specific details are given to provide a thorough understanding of embodiments. The embodiments can be practiced without one or more of the specific details, or with other methods, components, materials, etc. In other instances, well-known structures, materials, or operations, such as, for example, power supplies, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Embodiments of the system can be implemented in a variety of electronic or communication devices in which a sensitive clock signal having desired characteristics is desired. In one implementation, the system can be used to provide a reliable clock signal for smooth operation of a wireless circuit. Devices that can implement the system include, but are not limited to, mobile phones, laptops, personal digital assistants (PDAs), GPS units, modems, wireless computer peripherals, and so on. These devices can be employed in a variety of applications such as streaming, conferencing, and surveillance.

In one embodiment, a low jitter clock (LJC) generator provides an LJC signal to a wireless circuit. The LJC signal is provided through an LJC driver circuit having a receive buffer and a clock buffer. The receive buffer and the LJC generator are supplied with a first power supply, while the clock buffer and the wireless circuit are supplied with a second power supply to reduce the effect of noise on the LJC signal.

Figure 1:
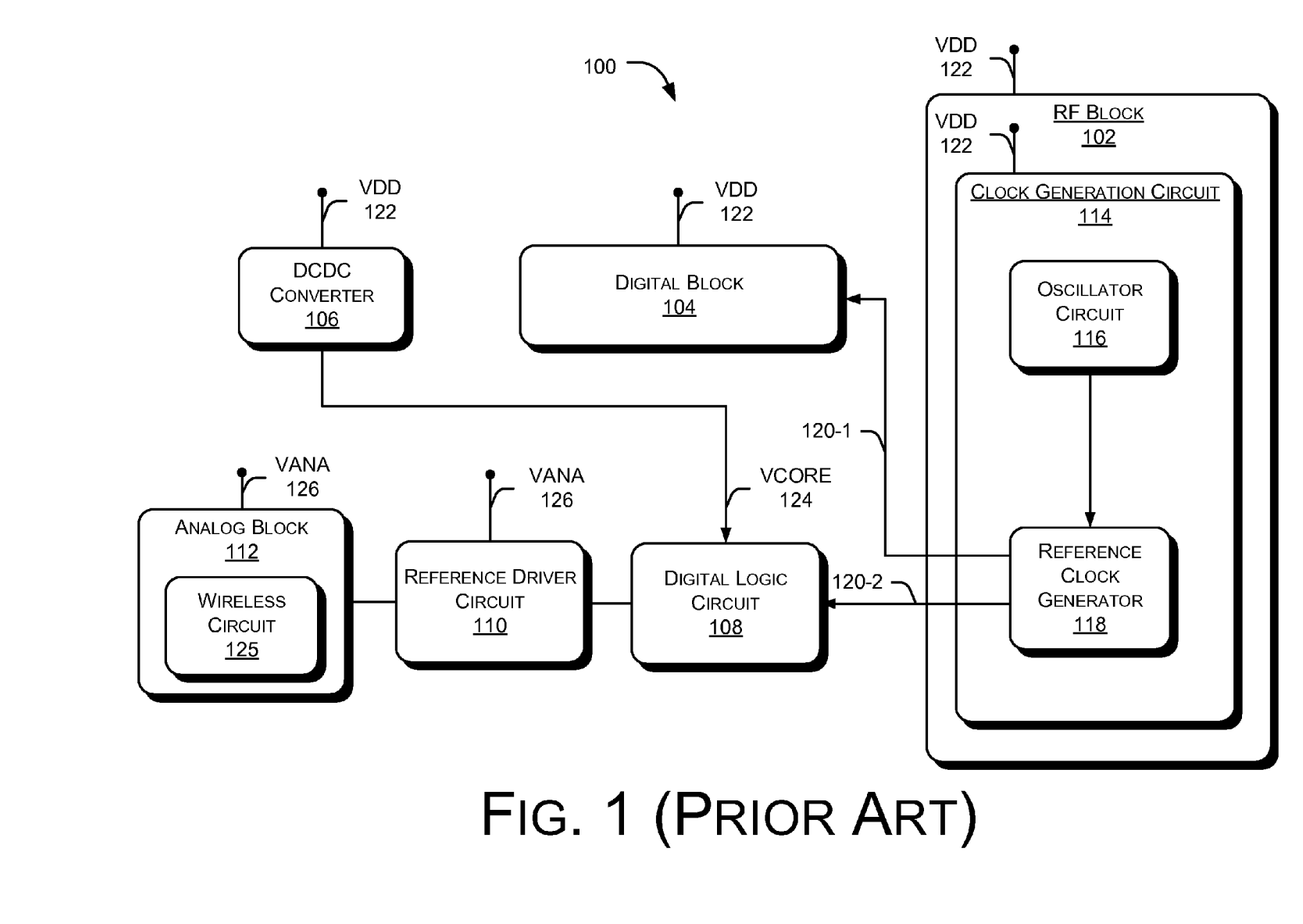
FIG. 1 illustrates a block diagram of a typical system to generate a clock signal in a wireless device.

FIG. 1 illustrates a block diagram of a typical system 100 to generate a clock signal in a wireless device. The system 100 includes a radio frequency (RF) block 102, a digital block 104, a direct current-to-direct current (DC-DC) converter 106, a digital logic circuit 108, a reference driver circuit 110, and an analog block 112. The RF block 102 has a clock generation circuit 114 including an oscillator circuit 116 and a reference clock generator 118. Typically, the oscillator circuit 116 is connected to a crystal oscillator source (not shown in the figure and typically external to the oscillator circuit), such as a quartz crystal, and provides an input signal to the reference clock generator 118. Subsequently, the reference clock generator 118 generates multiple clock signals 120-1 and 120-2 for a diversity of blocks and circuits, such as the digital block 104 and the digital logic circuit 108. The clock signals 120-1 and 120-2 are collectively referred to as clock signals 120 hereinafter. The digital logic circuit 108 can be, for example, a clock divider circuit.

The RF block 102, the clock generation circuit 114, the digital block 104, and the DC-DC converter 106 are supplied with a common power supply 122, hereinafter referred to as VDD 122. The DC-DC converter 106 regulates the VDD 122 applied as input for providing a regulated power supply 124, hereinafter referred to as VCORE 124, to the digital logic circuit 108. The reference driver circuit 110 and the analog block 112 are provided with a power supply 126, hereinafter referred to as VANA 126. The analog circuit can incorporate a variety of electrical circuits including a wireless circuit 125, such as a Bluetooth circuit. In one implementation, the analog block 112 is located on a separate chip on which the reference driver circuit 110 is not located.

In operation, the clock signal 120-2 is applied to the wireless circuit 125 included in the analog block 112 through the digital logic circuit 108 and the reference driver circuit 110. This clock signal 120-2 is desired to be free from disturbances, such as frequency drifts and jitters, for reliable operation of the wireless circuit 125. However, disturbances may get coupled to the clock signal 120-2 due to the operation of the RF block 102, the digital block 104, and other electrical circuits such as the DC-DC converter 106.

Generally, the RF block 102 is activated at particular instants, for example, on receiving frequency modulation (FM) signals. The activation of the RF block 102 triggers the reference clock generator 118 through the oscillator circuit 116 for providing the clock signal 120-2. In other words, the RF block 102 gets switched ON to perform a desired operation at a particular instant of time and then gets switched OFF. The clock signal 120-2 actuates the wireless circuit 125 in the analog block 112 through the digital logic circuit 108 and the reference driver circuit 110.

As the RF block 102 and the clock generation circuit 114 share the VDD 122, activation of the RF block 102 causes a sudden change in voltage across the clock generation circuit 114. On account of the RF block 102 turning ON and OFF, a variation in current is obtained at a separation node. The separation node refers to a location on the common circuit from where the VDD 122 is branched to other components of the RF block 102 and the clock generation circuit 114. The variation in current causes a sudden change in the VDD 122 applied to the clock generation circuit 114 through common impedance of the common circuit.

The sudden change in the VDD 122 induces deterministic jitters in the clock signals 120 at particular instants of time due to capacitive coupling between the VDD 122 and clock signals 120. These particular instants refer to instants when the RF block 102 gets switched ON and OFF. Distinctively, the deterministic jitters appear as an unwanted phase shift of the clock signals 120. As a result, the clock signals 120 suffer from a frequency drift beyond the allowable frequency range of the clock signals 120 based on the following equation:

$$\phi = 2 \times \pi \times \Delta T \times F \qquad (1)$$

In equation (1), $\phi$ is the phase shift in radians, $\Delta T$ is the time difference between generation of an expected clock signal and a received clock signal in milliseconds, and F represents the frequency drift of the clock signals 120 in hertz. The equation (1) shows that the phase shift and the frequency drift of the clock signals 120 are directly proportional to each other. Therefore, a sudden change in the phase shift causes an unwanted change in frequency of the clock signals 120 making it drift beyond an allowable frequency range for a reliable operation of the wireless circuit 125.

Moreover, the VDD 122, applied to the RF block 102 and the clock generation circuit 114, is shared with the digital block 104. The digital block 104 may include a variety of components, such as a microcontroller and digital signal processing (DSP) circuits, to perform a diversity of operations such as signal processing and generation of an interrupt signal. Based on the operation to be performed, different combinations of the components in the digital block 104 are activated. As a result, there is a voltage fluctuation in the common circuit used to share the VDD 122 between the digital block 104 and the clock generation circuit 114. This voltage fluctuation introduces a random jitter in the clock signal 120-2, generated by the reference clock generator 118, due to a capacitive and magnetic coupling between the VDD 122 and the clock signal 120-2.

Further, the clock signal 120-2 is provided to the wireless circuit 125 in the analog block 112 through the digital logic circuit 108 and the reference driver circuit 110. The digital logic circuit 108 processes the received clock signal 120-2 to adapt the characteristics, such as pulse width, of the clock signal 120-2 for reliable operation of the wireless circuit 125. However, the clock signal 120-2 suffers from the disturbances due to the DC-DC converter 106 as the clock signal 120-2 passes to the reference driver circuit 110 via the digital logic circuit 108.

The DC-DC converter 106 provides the VCORE 124 to the digital logic circuit 108. The VCORE 124 suffers from noise due to the capacitive coupling between the VCORE 124 and the clock signal 120-2 in the digital logic circuit 108 and thus induces a jitter on the clock signal 120-2. The jitter can also get introduced in the clock signal 120-2 due to the coupling between the clock signal 120-2 and other clock signals, such as the clock signal 120-1, generated by the reference clock generator 118, having different characteristics. Also, a fluctuation in any other clock signal can also introduce jitter in the clock signal 120-2. As a result, the clock signal 120-2, as received by the wireless circuit 125, can have disturbances arising from multiple sources, thereby affecting the performance of the wireless circuit 125.

Figure 2:
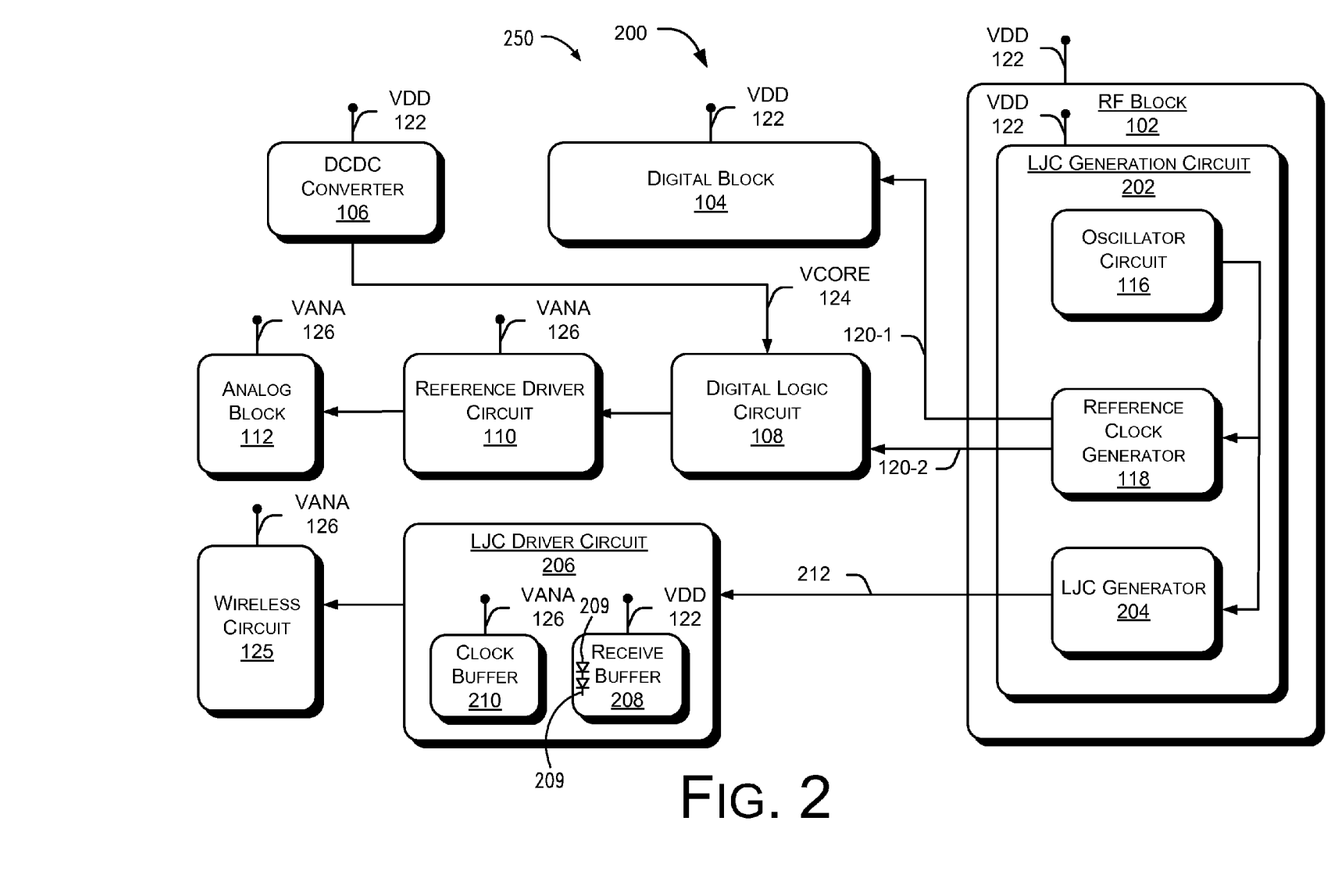
FIG. 2 illustrates a block diagram of an embodiment of a wireless device including a system to generate a low jitter clock signal.

FIG. 2 illustrates a block diagram of an embodiment of a system 200 configured to generate a low jitter clock signal for an electronic device, such as a wireless device 250. In one embodiment, the system 200 may be implemented on a single chip. In other embodiments, parts of the system 200 may be implemented on different chips placed in close proximity to each other. The system 200 includes the digital block 104, the DC-DC converter 106, the digital logic circuit 108, and the reference driver circuit 110, which operate in a manner similar to that described with reference to FIG. 1. The system 200 further includes the RF block 102, the analog block 112 and the wireless circuit 125. The wireless circuit 125 is, however, separated from the analog block 112. In an embodiment, the RF block 102 includes a low jitter clock (LJC) generation circuit 202 having the oscillator circuit 116, the reference clock generator 118, and an LJC generator 204. The system 200 also includes an LJC driver circuit 206 configured to drive the wireless circuit 125. The LJC driver circuit 206 includes a receive buffer 208 and a clock buffer 210. The LJC generator 204 receives an input signal from the oscillator circuit 116. The LJC generator 204 may be, for example, a standard clock generate, and as illustrated is separate from the reference clock generator 110. The LJC generator 204 can be fed with the VDD 122, while the wireless circuit 125 can be supplied with the VANA 126.

In operation, the LJC generator 204 can generate a diversity of clock signals, particularly to cater to a variety of wireless circuits. In an implementation, the LJC generator 204 can generate a clock signal 212 for a wireless circuit, for example the wireless circuit 125, located on a separate chip that does not include the LJC generator 204. In another implementation, the wireless circuit 125 can be located on the same chip that includes the LJC generator 204. The clock signal 212 may suffer from a jitter attributed to voltage fluctuations in the VDD 122 due to common impedance of conducting path of the VDD 122 and capacitive coupling of the VDD 122 with the clock signal 212.

Since the VDD 122 is shared with the RF block 102, the digital block 104, and the LJC generator 204 included in the LJC generation circuit 202, the voltage fluctuations in the VDD 122 can be caused due to operations of the RF block 102 and the digital block 104, as explained earlier in the detailed description of FIG. 1. Therefore, in order to provide a clock signal 212 in which the jitter is significantly reduced, the shared VDD 122 can be provided to the RF block 102, the digital block 104, and the LJC generator 204 through a Kelvin connection. The Kelvin connection may be directly connected to the source of the VDD 122 by using techniques already known in the art.

When the VDD 122 is supplied through the Kelvin connection, the common impedance is reduced in the conducting path of the VDD 122. The reduction in the common impedance significantly reduces the effects of voltage fluctuations in the VDD 122 on the clock signal 212. The relationship between the fluctuating voltage, current and impedance of the conducting path is given by the following equation:

$$V = \Delta I * Z \quad (2)$$

In equation (2), V is the fluctuating voltage in volts, $\Delta I$ is the change in current in the conducting path of the VDD 122 in milliamperes, and Z represents the common impedance of the conducting path of the VDD 122 in ohms. Equation (2) shows that the fluctuating voltage V is directly proportional to the common impedance Z. Therefore, when the common impedance Z is low, the associated fluctuating voltage V is also low. To further reduce the common impedance of the conducting path of the VDD 122, in one implementation, the Kelvin connection can be implemented using a thick trace or conducting path. The thick trace offers lower resistance, and therefore facilitates in reducing the common impedance of the conducting path of the VDD 122. In this way, the jitters on the clock signal 212 generated by the LJC generator 204 can be substantially reduced.

Further, the LJC generator 204 generates the clock signal 212 with the desired characteristics, such as pulse width, which are predominantly needed for the reliable operation of the wireless circuit 125. The clock signal 212 can be directly provided to the LJC driver circuit 206 bypassing the digital logic circuit 108. As a result, any jitter in the clock signal 212 on account of coupling between the noisy VCORE 124 in the digital logic circuit 108 and the clock signal 212 can be significantly reduced. Due to the separate LJC generator 204 for the wireless circuit 125, coupling of the clock signal 212 with other clock signals, such as the clock signals 120 that are simultaneously generated by the reference clock generator 118 and have different characteristics, is also significantly reduced.

In the aforesaid embodiment, the clock signal 212 can be provided to the receive buffer 208 included in the LJC driver circuit 206, which is separate from the reference driver circuit 110. The receive buffer 208 can have a variety of configurations such as two inverters directly connected to each other in cascade. As illustrated, in one embodiment, the receive buffer 208 comprises two inverters 209. The receive buffer 208 sharpens the rate of change of the edge of the clock signal 212 to provide a high edge rate to the clock signal 212. The high edge rate of the clock signal 212 facilitates in reducing cross timing of a pulse of the clock signal 212 on a zero reference line, which corresponds to zero voltage, during transition of the clock signal 212 operating from one power supply, such as VDD 122, to another power supply such as VANA 126. Reduction of the cross timing corresponds to a less delayed transition of the clock signal 212 from high voltage to low voltage and vice versa, about the zero voltage reference. A sharpened clock signal generally has a small transition time, which means reduced coupling between a power supply and the clock signal 212.

It is to be noted that the power supply fed to the receive buffer 208 is VDD 122. In this way, the receive buffer 208 too operates on the power supply of the LJC generator 204. The sharpened clock signal 212 can then be forwarded to the clock buffer 210 in the LJC driver circuit 206. The clock buffer 210, which is supplied with the VANA 126, buffers the sharpened clock signal 212 for providing a smooth clock signal 212. Since the clock signal 212 is processed at the VDD 122 in the receive buffer 208 and then at the VANA 126 in the clock buffer 210, there is a reduced coupling between the VANA 126 and the clock signal 212. This reduced coupling further reduces introduction of jitter from the VANA 126 to the clock signal 212. The smoothened clock signal 212, also referred to as buffered clock signal 212, can be then fed to the wireless circuit 125.

Figure 3:
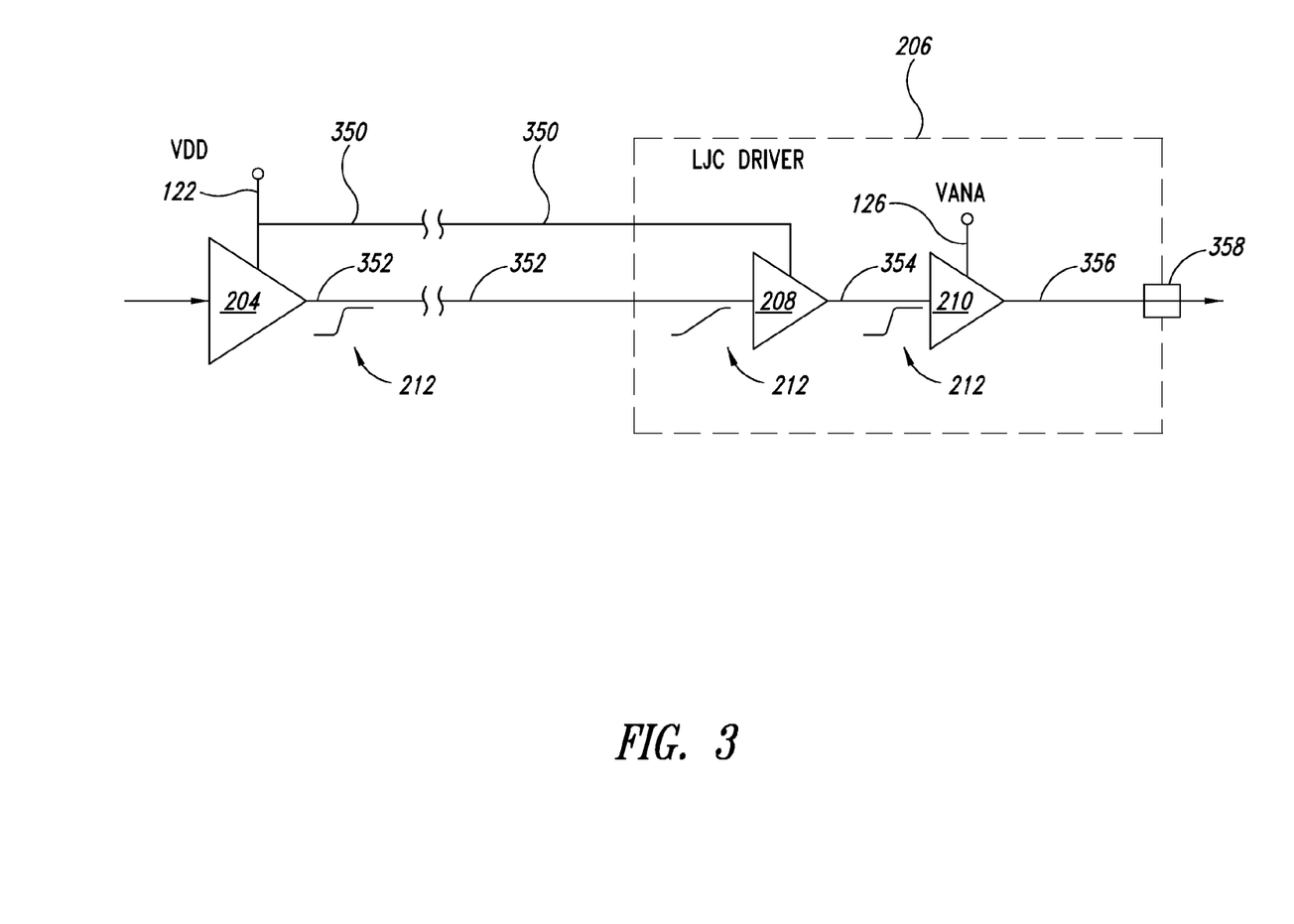
FIG. 3 illustrates an embodiment of a low jitter clock generator and a low jitter clock driver.

FIG. 3 illustrates an embodiment of an LJC generator 204 and an LJC driver 206 suitable for use, for example, in the embodiment of FIG. 2. The LJC generator 204 generates a clock signal 212 with a relatively sharp rising edge based on a signal received from an oscillator (see oscillator 116 of FIG. 2). The LJC generator 204 is powered by a first voltage VDD 122, which is typically a low-noise power supply. The LJC generator 204 is coupled to the LJC driver 206 through an electrical connection 352, typically a trace or a conduit, which is typically long enough that the signal 212 has a slow rising edge when it is received by the LJC generator, and may have accumulated a lot of jitter. The signal 212 is sharpened by the receive buffer 208, which may comprise one or more inverters. The receive buffer 208 is powered by the first voltage VDD 122, typically through a long conduit or trace 350. The sharpened signal 212 produced by the receive buffer 208 is provided to the clock buffer 210 through a short conduit or trace 354. The clock buffer 210 transitions the sharpened signal 212 to a different reference voltage domain or a ground domain. As illustrated, the clock buffer 210 is powered by a second voltage VANA 126. The output signal 212 is provided on a conduit or trace 356, and may, for example, be coupled to a terminal 358 of the LJC driver 206.

Figure 4:
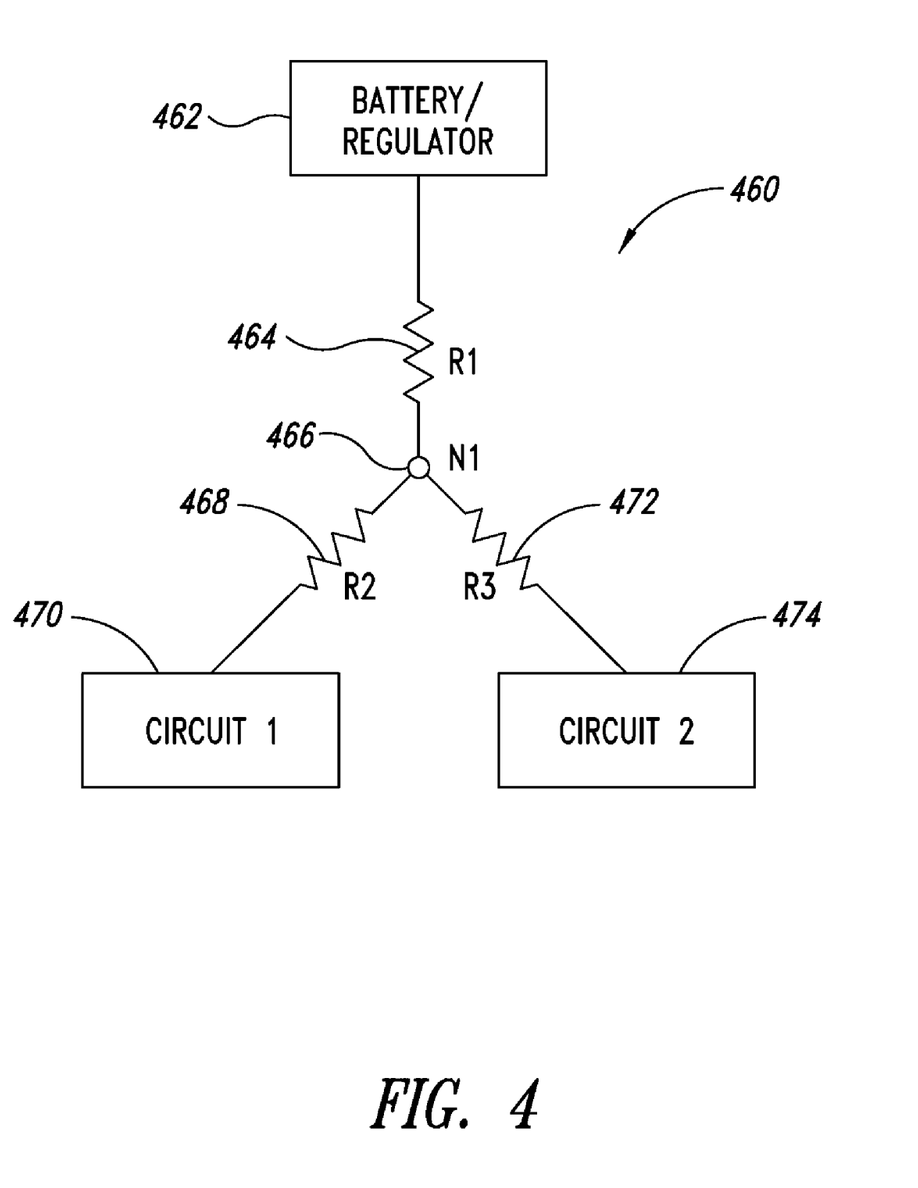
FIG. 4 illustrates an embodiment of a Kelvin connection.

FIG. 4 illustrates an embodiment of a Kelvin connection 460, suitable for use, for example, in the embodiment of FIG. 2. The Kelvin connection 460 comprises a first conduit with a first impedance represented by a first resistance R1 464 coupling a voltage source 462, such as a battery or regulator, to a first node N1 466. A first circuit 470 (for example, the RF block 102 of FIG. 2) is coupled to the first node N1 466 through a second conduit with a second impedance represented by a second resistance R2 468. A second circuit 474 (for example, the digital block 104 of FIG. 2) is coupled to the first node N1 through a third conduit with a third impedance represented by a third resistance R3 472. The common impedance represented by R1 464 is minimized in a Kelvin connection by having the first node be a close as possible to the voltage source 462.

Figure 5:
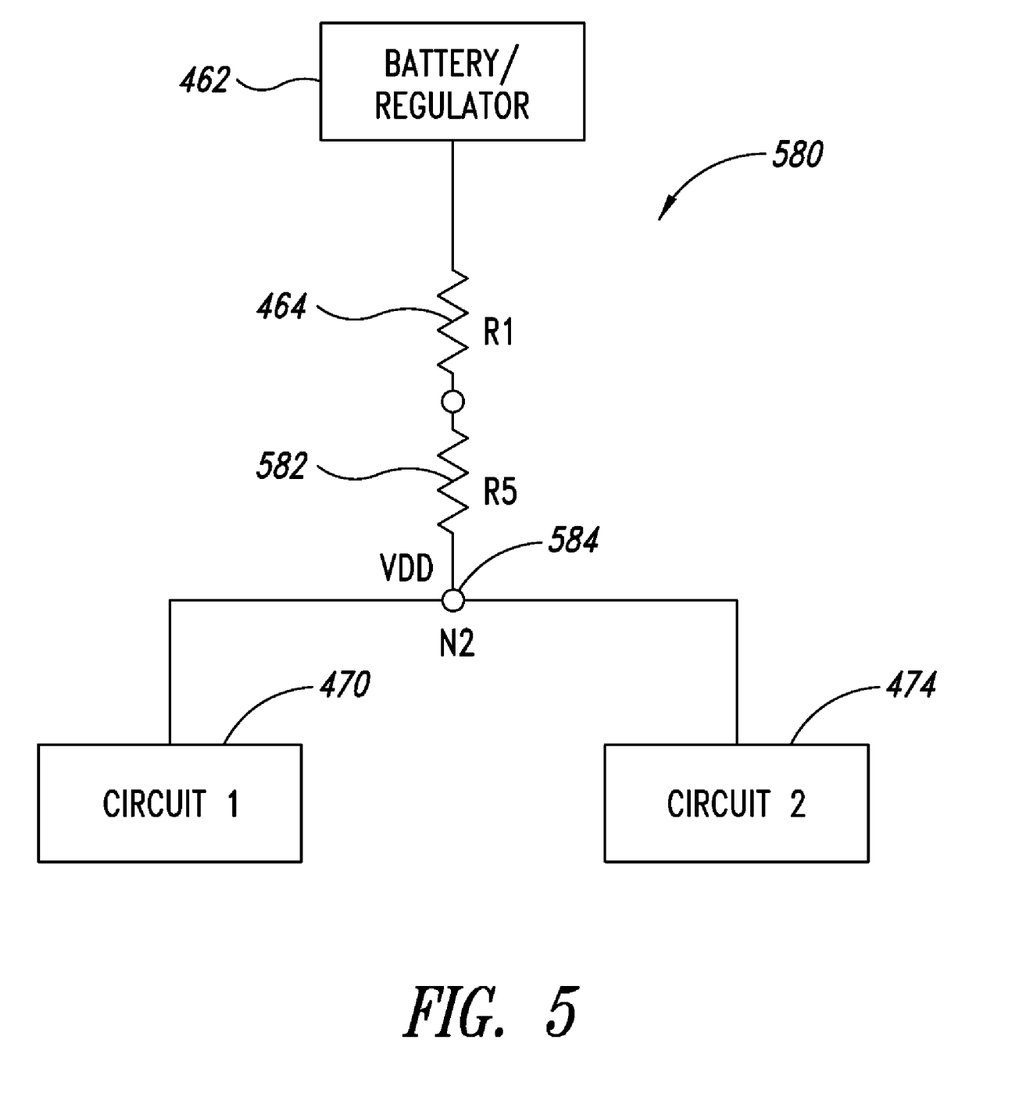
FIG. 5 illustrates an embodiment of an alternative connection.

FIG. 5 illustrates an alternative connection 580 (non-Kelvin) where the first circuit 470 and the second circuit 474 share a single longer conduit or trace represented by the resistances 464 and 582, and connect to the same voltage VDD at node N2 584. Any change in current drawn by the first circuit 470 will change the voltage at node N2 584, which will thus be communicated to the second circuit 474.

Although embodiments for a low jitter clock generation mechanism have been described in language specific to structural features and/or methods, it is to be understood that the appended claims are not necessarily limited to the specific features or methods described. Rather, the specific features and methods are disclosed as exemplary implementations for the low jitter clock generation mechanism. The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used therein should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a wireless circuit configured to receive power from a first power supply;
a low jitter clock (LJC) generator configured to provide a clock signal to the wireless circuit, wherein the LJC generator is configured to receive power from a second power supply; and
an LJC driver circuit configured to receive the clock signal from the LJC generator and transmit the clock signal to the wireless circuit after processing the clock signal, wherein the LJC driver circuit comprises a clock buffer configured to receive power from the first power supply and a receive buffer configured to receive power from the second power supply.

2. The system as claimed in claim 1 wherein the receive buffer is configured to sharpen the clock signal to provide a sharpened clock signal to the clock buffer.

3. The system as claimed in claim 2 wherein the clock buffer is configured to buffer the sharpened clock signal to provide a buffered clock signal to the wireless circuit.

4. The system as claimed in claim 1 wherein the LJC generator is dedicated to the wireless circuit.

5. The system as claimed in claim 1 wherein the wireless circuit is a short-range communication circuit.

6. The system as claimed in claim 5 wherein the wireless circuit is a Bluetooth circuit.

7. The system as claimed in claim 1 wherein the wireless circuit and the LJC generator are disposed on a single chip.

8. The system as claimed in claim 1 wherein the LJC generator is part of an LJC generation circuit included in a radio frequency block.

9. The system as claimed in claim 1 wherein the receive buffer comprises at least one inverter.

10. A system, comprising:
a low jitter clock (LJC) generator configured to provide at least one clock signal; and
an LJC driver circuit comprising:
a receive buffer to receive the clock signal from the LJC generator, wherein the receive buffer is configured to sharpen the clock signal to provide a sharpened clock signal; and
a clock buffer configured to buffer the sharpened clock signal and provide the buffered clock signal to a wireless circuit,
wherein the clock buffer and the wireless circuit share a first power supply and the LJC generator and the receive buffer share a second power supply.

11. The system as claimed in claim 10 wherein the system comprises an RF block that includes an LJC generation circuit, wherein the LJC generation circuit includes the LJC generator.

12. The system as claimed in claim 11 wherein the RF block shares a common power supply with at least one digital block and at least one direct current-to-direct current (DC-DC) converter through a Kelvin connect configuration.

13. The system as claimed in claim 10 wherein the receive buffer comprises at least one inverter.

14. A method, comprising:
generating a clock signal;
sharpening the clock signal to provide a sharpened clock signal;
buffering the sharpened clock signal to provide a buffered clock signal; and providing the buffered clock signal to a wireless circuit, wherein:
sharpening the clock signal comprises providing the clock signal to a first buffer powered by a first power supply; and
buffering the sharpened clock signal comprises providing the sharpened clock signal to a second buffer powered by a second power supply.

15. The method as claimed in claim 14 wherein the sharpening the clock signal comprises increasing a rate of change of an edge of the clock signal.

16. A system, comprising:
means for generating a clock signal;
means for sharpening the clock signal to provide a sharpened clock signal;
means for buffering the sharpened clock signal to provide a buffered clock signal; and
means for providing the buffered clock signal to a wireless circuit, wherein:
the means for sharpening the clock signal is coupled to a first power supply; and
the means for buffering is coupled to a second power supply.

17. The system of claim 16 wherein the means for sharpening the clock signal is configured to increase a rate of change of an edge of the clock signal.

18. The system of claim 17 wherein the means for sharpening comprises an inverter.

\* \* \* \* \*